United States Patent
Lee

(10) Patent No.: US 12,265,309 B2
(45) Date of Patent: Apr. 1, 2025

(54) DISPLAY DEVICE

(71) Applicant: LG Display Co., Ltd., Seoul (KR)

(72) Inventor: JungHyun Lee, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/603,975

(22) Filed: Mar. 13, 2024

(65) Prior Publication Data

US 2024/0219791 A1 Jul. 4, 2024

Related U.S. Application Data

(63) Continuation of application No. 18/127,330, filed on Mar. 28, 2023, now Pat. No. 11,966,137.

(30) Foreign Application Priority Data

Mar. 29, 2022 (KR) .......... 10-2022-0038954
Oct. 14, 2022 (KR) .......... 10-2022-0132652

(51) Int. Cl.
*G02F 1/1368* (2006.01)
*G02F 1/1362* (2006.01)

(52) U.S. Cl.
CPC ...... *G02F 1/1368* (2013.01); *G02F 1/136209* (2013.01); *G02F 1/136222* (2021.01); *G02F 1/136286* (2013.01)

(58) Field of Classification Search
CPC ............ G02F 1/1368; G02F 1/136209; G02F 1/136222; G02F 1/136286; G02F 1/13685
See application file for complete search history.

(56) References Cited

U.S. PATENT DOCUMENTS

| | | |
|---|---|---|
| 2008/0079874 A1 | 4/2008 | Muneyoshi et al. |
| 2015/0103296 A1 | 4/2015 | Kwak et al. |
| 2017/0269421 A1 | 9/2017 | Oka et al. |
| 2019/0187523 A1* | 6/2019 | Jian ............... G02F 1/1368 |
| 2020/0243566 A1 | 7/2020 | Liu |

FOREIGN PATENT DOCUMENTS

KR 10-2009-0112842 A 10/2009

* cited by examiner

*Primary Examiner* — James A Dudek
(74) *Attorney, Agent, or Firm* — Birch, Stewart, Kolasch & Birch, LLP

(57) ABSTRACT

A display device can include a first substrate having an upper surface and a lower surface, an active layer on the lower surface of the first substrate and including a channel part, a first connection part connected to a first side of the channel part and a second connection part connected to a second side of the channel part, a gate electrode under the active layer and overlapping the channel part, a first electrode connected to a first surface of the first connection part, a second electrode connected to a second surface of the first connection part, and a third electrode connected to the second connection part. Also, a second substrate is under the gate electrode, a liquid crystal layer is between the first and second substrates, and a backlight is under the second substrate.

19 Claims, 14 Drawing Sheets

DISPLAY DEVICE

CROSS-REFERENCE TO RELATED APPLICATIONS

This application is a Continuation Application of U.S. application Ser. No. 18/127,330, filed on Mar. 28, 2023, which claims priority to Korean Patent Application No. 10-2022-0038954 filed in the Republic of Korea on Mar. 29, 2022, and Korean Patent Application No. 10-2022-0132652 filed in the Republic of Korea on Oct. 14, 2022, all of these applications being hereby expressly incorporated by reference as if fully set forth herein into the present application.

BACKGROUND

Technical Field

The present disclosure relates to a display device.

Description of the Related Art

Display devices, such as liquid crystal display device or organic light emitting device, include a substrate equipped with thin film transistors as switching or driving elements. A separate driving element is connected to an outer part of the substrate to drive the thin film transistor, and for this reason, a size of a bezel of the display device is increased. Large bezel areas around a display are often undesirable and take up additional space.

Also, in order to reduce or eliminate the bezel size of the display device, the substrate was placed upside down so that an opposite surface of the substrate on which the thin film transistor is not provided is configured to be a display surface.

However, for example, when the substrate is upside down in a liquid crystal display device, a light emitted from a backlight placed under the substrate can shine on a channel part of an active layer constituting the thin film transistor, which can degrade the channel part over time. In addition, to solve this problem, a light shielding layer can be added to cover the channel part of the active layer for protection, but in this situation, there is a problem that the aperture ratio of the display device decreases and image quality can become impaired, and the configuration becomes more complicated and increases manufacturing time and costs.

SUMMARY OF THE DISCLOSURE

The present disclosure has been made in view of the above problems, and it is an object of the present disclosure to provide a display device capable of preventing light from directly irradiating and damaging a channel part of an active layer even if a substrate equipped with a thin film transistor is disposed upside down.

In accordance with an aspect of the present disclosure, the above and other objects can be accomplished by the provision of a display device including a first substrate having an upper surface which is a display surface and a lower surface facing the upper surface; an active layer provided on the lower surface of the first substrate and including a channel part, a first connection part connected to one side of the channel part, and a second connection part connected to the other side of the channel part; a gate electrode provided under the active layer and overlapping the channel part; a second substrate provided under the gate electrode; a liquid crystal layer provided between the first substrate and the second substrate; and a backlight provided under the second substrate, in which light emitted from the backlight is blocked by the gate electrode after passing through the second substrate and the liquid crystal layer, and prevented from entering into or on the channel part.

In accordance with another aspect of the present disclosure, the above and other objects can be accomplished by the provision of a display device including a first substrate having an upper surface which is a display surface and a lower surface facing the upper surface; an active layer provided on the lower surface of the first substrate and including a channel part, a first connection part connected to one side of the channel part, and a second connection part connected to the other side of the channel part; a gate electrode spaced apart from the active layer and overlapping the channel part; a source electrode connected to the first connection part of the active layer; a drain electrode connected to the second connection part of the active layer; and a pixel electrode connected to the drain electrode, in which the active layer is provided between the first substrate and the gate electrode.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
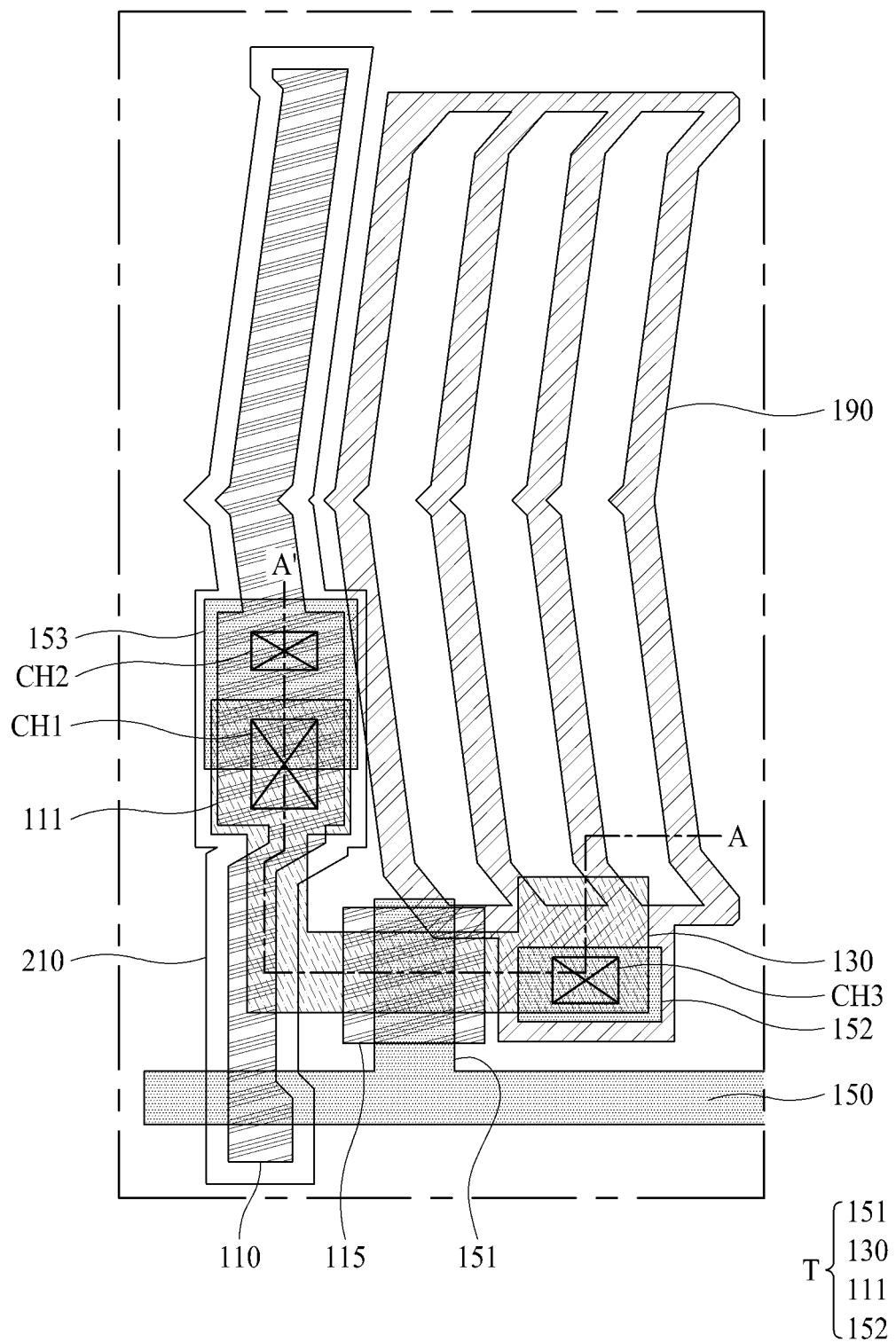
FIG. 1 is a plan view illustrating a display device according to one embodiment of the present disclosure.

Reference will now be made in detail to embodiments of the present disclosure, examples of which can be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and can be changed as is known in the art, with the exception of steps and/or operations necessarily occurring in a particular order. Like reference numerals designate like elements throughout. Names of the respective elements used in the following explanations are selected only for convenience of writing the specification and can be thus different from those used in actual products.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the embodiments of the present disclosure are not limited to the illustrated details. Like reference numerals refer to like elements throughout. In the following description, when the detailed description of the relevant known function or configuration is determined to unnecessarily obscure the important point of the present disclosure, the detailed description will be omitted. In a situation where "comprise," "have," and "include" described in the present specification are used, another part can be added unless "only" is used. The terms of a singular form can include plural forms unless referred to the contrary.

In construing an element, the element is construed as including an error range although there is no explicit description.

In describing a position relationship, for example, when a position relation between two parts is described as "on," "over," "under," and "next," one or more other parts can be disposed between the two parts unless a more limiting term, such as "just" or "direct(ly)" is used.

In describing a time relationship, for example, when the temporal order is described as, for example, "after," "subsequent," "next," and "before," a situation which is not continuous can be included unless a more limiting term, such as "just," "immediate(ly)," or "direct(ly)" is used.

It will be understood that, although the terms "first," "second," etc., can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., can be used. Such terms are used for merely discriminating the corresponding elements from other elements and the corresponding elements are not limited in their essence, sequence, or precedence by the terms. It will be understood that when an element or layer is referred to as being "on" or "coupled to" another element or layer, it can be directly on or directly coupled to the other element or layer, or intervening elements or layers can be present. Also, it should be understood that when one element is disposed on or under another element, this can denote a situation where the elements are disposed to directly contact each other, but can denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

The term "surround" as used herein includes at least partially surrounding as well as entirely surrounding one or more of the associated elements. Similarly, the term "cover" as used herein includes at least partially covering as well as entirely covering one or more of the associated elements. For example, if an encapsulation layer surrounds a dam, this can be construed as the encapsulation layer at least partially surrounding the dam. However, in some embodiments, the encapsulation layer can entirely surround the dam. The meaning in which the term "surround" is used herein can be further specified based on the associated drawings and embodiments. In the present disclosure, the terms "surround," "at least partially surround," "completely surround" or the like is used. In accordance with the definition of "surround" as set forth above, when only the term "surround" is used in an embodiment, it can mean either at least partially surrounding or entirely surrounding one or more of the associated elements. The same applies for the term "cover."

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together with in co-dependent relationship.

Hereinafter, embodiments of the present disclosure will be described in detail with reference to the accompanying drawings. In adding reference numerals to elements of each of the drawings, although the same elements are illustrated in other drawings, like reference numerals can refer to like elements. Also, for convenience of description, a scale of each of elements illustrated in the accompanying drawings differs from a real scale, and thus, is not limited to a scale illustrated in the drawings.

FIG. 1 is a schematic plan view of a display device according to one embodiment of the present disclosure, which illustrates only one sub-pixel of the display device.

As shown in FIG. 1, the display device according to one embodiment of the present disclosure includes a gate line 150, a data line 110, a thin film transistor T, a first light blocking layer 115, a connection electrode 153, a pixel electrode 190, and a second light blocking layer 210.

The gate line 150 and the data line 110 are arranged to cross each other to define a pixel area. The gate line 150 can be arranged in a first direction, for example, a horizontal direction, and the data line 110 can be arranged in a second direction, for example, a vertical direction.

The thin film transistor T is provided near an intersection region between the gate line 150 and the data line 110. The thin film transistor T includes a gate electrode 151, an active layer 130, a source electrode 111, and a drain electrode 152.

The gate electrode 151 can protrude from the gate line 150. Specifically, the gate electrode 151 protrudes from the gate line 150 in the second direction, for example, in a vertical direction. For example, the gate electrode 151 can protrude from the gate line 150 in a same direction as the data line 110. The gate electrode 151 and the gate line 150 can be formed of a same material on a same layer as one body through a same process.

The active layer 130 is provided to overlap the gate electrode 151, the source electrode 111, and the drain electrode 152. Specifically, one end of the active layer 130 overlaps the source electrode 111, the other end of the active layer 130 overlaps the drain electrode 152, and a portion between one end and the other end of the active layer 130 overlaps the gate electrode 151.

The source electrode 111 is formed as a portion of the data line 110. However, the present invention is not limited thereto, and the source electrode 111 can protrude from the data line 110. The source electrode 111 and the data line 110 can be formed as one body. A width of the source electrode 111 in the first direction, for example, in the horizontal direction, can be greater than a width of other parts of the data line 110 except for the source electrode 111 to facilitate an electrical connection between the source electrode 111 and the active layer 130 (e.g., the data line 110 can have a pad area for connection to the active layer 130). The source electrode 111 can be connected to the active layer 130 through a first contact hole CH1. In addition, the source electrode 111 can be connected to the connection electrode 153 through the second contact hole CH2.

The drain electrode 152 can be located near the gate electrode 151. The drain electrode 152 is connected to the pixel electrode 190 through a third contact hole CH3.

The first light blocking layer 115 overlaps at least a portion of the gate electrode 151, and particularly, overlaps a portion of the active layer 130, more specifically, a channel part 131 of the active layer 130. The first light blocking layer 115 can overlap the channel part 131 of the active layer 130 to prevent light from being incident on the channel part 131. The first light blocking layer 115 can be formed not to overlap the gate line 150 and the data line 110. In addition, the first light blocking layer 115 can be formed so as not to overlap the source electrode 111 and the drain electrode 152. The first light blocking layer 115 can be formed of a conductive material.

The connection electrode 153 is formed to overlap the source electrode 111 and the active layer 130. The connection electrode 153 can connect the source electrode 111 and the active layer 130 to each other, and to this end, the connection electrode 153 can be connected to each of the source electrode 111 and the active layer 130. In particular, the connection electrode 153 can be connected to the source electrode 111 through a second contact hole CH2.

The pixel electrode 190 is provided in a pixel area defined by the gate line 150 and the data line 110. The pixel electrode 190 is connected to the drain electrode 152 through a third contact hole CH3. The pixel electrode 190 can have a structure having a plurality of slits, and thus a fringe field can be formed between the pixel electrode 190 and a common electrode.

The second light blocking layer 210 can extend in the same second direction as an arrangement direction of the data line 110 while overlapping the data line 110 (e.g., the second light blocking layer 210 can cover the data line 110). The width of the second light blocking layer 210 in the horizontal direction can be greater than the width of the data line 110 in the horizontal direction, and thus the entire portion of the data line 110 can overlap the second light blocking layer 210. The light blocking layer 210 is provided to overlap the data line 110, which is a boundary area between sub-pixels emitting different colors, thereby preventing the light from mixing between the sub-pixels emitting different colors.

According to an embodiment of the present disclosure, since the channel part 131 of the active layer 130 is covered by the first light blocking layer 115 and the gate electrode 151, the second light blocking layer 210 does not need to additionally cover the channel part 131 of the active layer 130. Accordingly, the second light-shielding layer 210 can be formed so as not to overlap with the channel part 131 of the active layer 130, the first light-shielding layer 115, and the gate electrode 151. In addition, the second light shielding layer 210 can be formed so as not to overlap with the gate line 150.

Figure 2:
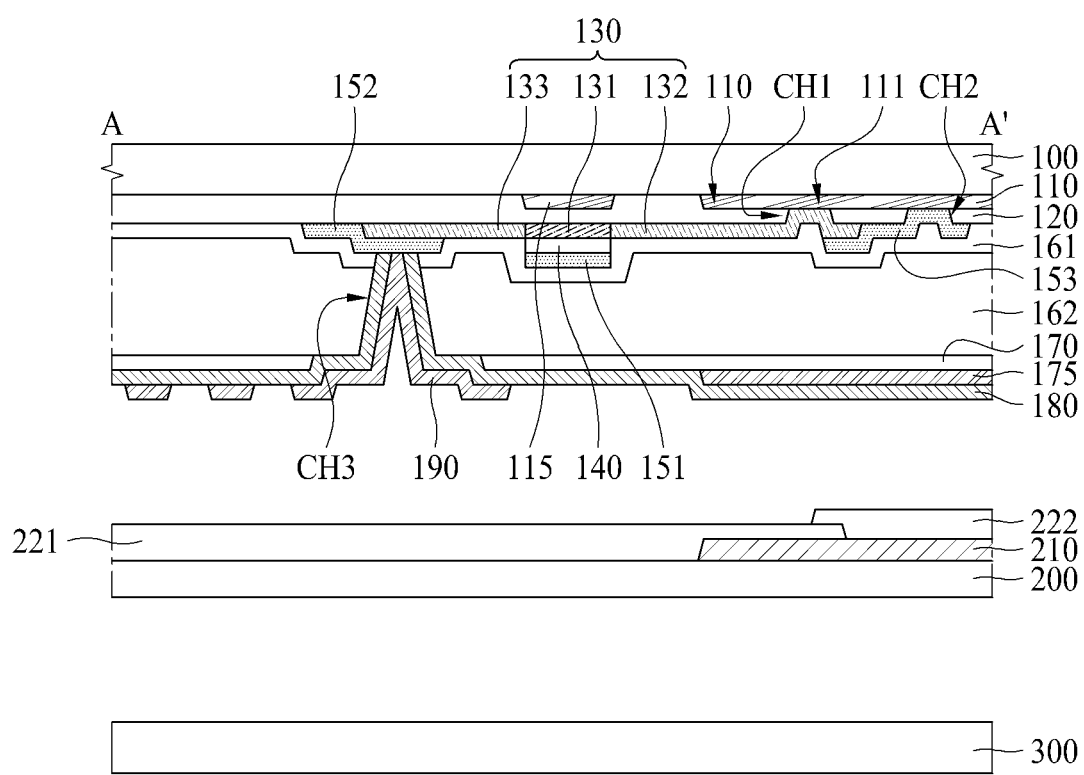
FIG. 2 is a schematic cross-sectional view of the display device according to one embodiment of the present disclosure, which corresponds to a cross-sectional view along A-A' line of FIG. 1.

FIG. 2 is a schematic cross-sectional view of the display device according to one embodiment of the present disclosure, which corresponds to a cross-sectional view along A-A' line of FIG. 1.

As shown in FIG. 2, the display device according to one embodiment of the present disclosure includes a first substrate 100, a second substrate 200, and a backlight 300.

The first substrate 100 can be formed of a thin film transistor substrate, and the second substrate 200 can be formed of a color filter substrate.

The first substrate 100 can be disposed above the second substrate 200 and the backlight 300, the second substrate 200 can be disposed between the first substrate 100 and the backlight 300, and the backlight 300 can be disposed below the first substrate 100 and the second substrate 200. Accordingly, the light emitted from the backlight 300 passes through the second substrate 200 and the first substrate 100 sequentially and then is emitted to the outside through an upper surface of the first substrate 100. The upper surface of the first substrate 100 becomes a surface on which an image is displayed (e.g., upper surface of the first substrate 100 can face toward a viewer).

At least one of the first substrate 100 and the second substrate 200 can be made of glass or plastic. At least one of the first substrate 100 and the second substrate 200 can be made of transparent plastic having flexible properties, such as polyimide. When polyimide is used as at least one of the first substrate 100 and the second substrate 200, heat-resistant polyimide that can withstand high temperatures can be used, considering that a high-temperature deposition process is performed on the first substrate 100 and the second substrate 200.

A first light shielding layer 115, a data line 110, and a source electrode 111 are provided on a lower surface of the first substrate 100. The first light blocking layer 115, the data line 110, and the source electrode 111 can be patterned on the same layer with the same material through the same process. Accordingly, the first light blocking layer 115 is made of a conductive material. The data line 110 and the source electrode 111 are formed in one body, and are insulated from the first light blocking layer 115 (e.g., the first light blocking layer 115 is spaced apart from the data line 110 and the source electrode 111). The upper surface of the first substrate 100 corresponds to a display surface, and the lower surface of the first substrate 100 corresponds to a surface opposite to the display surface.

A buffer layer 120 is formed on a bottom surface of the first light blocking layer 115, the data line 110, and the source electrode 111. The buffer layer 120 can protect the active layer 130 by blocking air and moisture. The buffer layer 120 can be formed of an inorganic insulating material, such as silicon oxide, silicon nitride, or metal oxide, but is not limited thereto and can be formed of an organic insulating material. The buffer layer 120 can be formed of a single layer or a plurality of layers.

The buffer layer 120 is provided with a first contact hole CH1 and a second contact hole CH2. The first contact hole CH1 and the second contact hole CH2 can be spaced apart from each other, and a predetermined region of the source electrode 111 can be exposed by the first contact hole CH1 and the second contact hole CH2.

An active layer 130 is formed on a lower surface of the buffer layer 120. The active layer 130 can include a channel part 131, a first connection part 132, and a second connection part 133. The first connection part 132 can be connected to one side of the channel part 131 and the second connection part 133 can be connected to the other side of the channel part 131.

The channel part 131 is made of a semiconductor material and overlaps the first light blocking layer 115 and the gate electrode 151. Specifically, the first light shielding layer 115 is provided above the channel part 131 and the gate electrode 151 is provided below the channel part 131. Accordingly, external light incident downward toward the channel part 131 is blocked by the first light shielding layer 115, and light emitted from the backlight 300 incident upward toward the channel part 131 after passing through the second substrate 200 is blocked by the gate electrode 151. In this way, the channel part 131 can be protected from both sides since the channel part 131 is sandwiched between the gate electrode 151 (e.g., which can protect form internal light coming from the backlight 300) and the first light shieling layer 115 (e.g., which can protect from external light, such as sunlight).

The first connection part 132 and the second connection part 133 can have conductive characteristics by selectively conducting a semiconductor material. The first connection part 132 and the second connection part 133 may not overlap the gate electrode 151. The first connection part 132 and the second connection part 133 have superior conductivity compared to the channel part 131, and each of them can serve as a wiring or a source/drain electrode. The first connection part 132 can be connected to the source electrode 111 provided above through the first contact hole CH1 provided in the buffer layer 120, and the second connection part 133 can be directly connected to the drain electrode 152 provided below.

The active layer 130 can include a semiconductor material, for example, an oxide semiconductor material. The oxide semiconductor material is, for example, an IZO (InZnO)-based oxide semiconductor material, an IGO (InGaO)-based oxide semiconductor material, an ITO (InSnO)-based oxide semiconductor material, an IGZO (InGaZnO)-based oxide material, an IGZTO (InGaZnSnO)-based oxide material, a GZTO (GaZnSnO)-based semiconductor material, a GZO (GaZnO)-based semiconductor material, an ITZO (InSnZnO)-based semiconductor material, and an FIZO (FeInZnO)-based semiconductor material oxide.

A gate insulating layer 140 is formed on a lower surface of the active layer 130, particularly, on a lower surface of the channel part 131 of the active layer 130. The gate insulating layer 140 insulates the active layer 130 from the gate electrode 151. The gate insulating layer 140 can be formed in the same pattern as the gate electrode 151 (e.g., gate insulating layer 140 and gate electrode 151 can have a same shape and same width), but is not limited thereto. The gate insulating layer 140 can overlap the channel part 131 and may not overlap the first and second connection parts 132 and 133. Alternatively, the gate insulating layer 140 can overlap the channel part 131, a portion of the first connection part 132, and a portion of the second connection part 133.

A gate electrode 151 is formed on a lower surface of the gate insulating layer 140, and a connection electrode 153 and a drain electrode 152 are formed on a lower surface of the first connection part 132 and the second connection part 133 of the active layer 130.

The gate electrode 151, the connection electrode 153, and the drain electrode 152 can be formed of the same material through the same process. The gate electrode 151, the connection electrode 153, and the drain electrode 152 can be formed of a single metal layer, or can be formed of a multi-layer metal layer.

The gate electrode 151 is spaced apart from the active layer 130 with the gate insulating layer 140 interposed therebetween, and is formed to overlap the channel part 131 of the active layer 130 and the first light blocking layer 115.

The connection electrode 153 can connect the source electrode 111 with the first connection part 132 of the active layer 130. Although the source electrode 111 and the first connection part 132 of the active layer 130 are directly connected through the first contact hole CH1, electrical connection characteristics between the source electrode 111 and the first connection part 132 of the active layer 130 can be improved by additionally forming the connection electrode 153. However, it is also possible to omit the connection electrode 153. One side of the connection electrode 153 contacts the source electrode 111 through the second contact hole CH2 provided in the buffer layer 120, and the other side of the connection electrode 153 is directly provided on the first connection part 132 of the active layer 130 to contact the lower surface of the first connection part 132. Also, the gate insulating layer 140 can be additionally provided on the upper surface of the connection electrode 153, and in this situation, the gate insulating layer 140 additionally provided on the upper surface of the connection electrode 153 does not cover at least a part of the second contact hole CH2 so that the connection electrode 153 contacts the source electrode 111 through the second contact hole CH2. In addition, the gate insulating film 140 additionally provided on the upper surface of the connection electrode 153 is provided so as not to cover at least a part of the first connection part 132 of the active layer 130 so that the connection electrode 153 can contact the first connection part 132 of the active layer 130 (e.g., see FIG. 3).

The drain electrode 152 is provided directly on the bottom surface of the second connection part 133 of the active layer 130 to contact the bottom surface of the second connection part 133. Accordingly, the drain electrode 152 is positioned below the active layer 130. On the other hand, the source electrode 111 is located above the active layer 130 and contacts the upper surface of the first connection part 132 of the active layer 130. Accordingly, the source electrode 111 can be positioned between the first substrate 100 and the active layer 130, and the drain electrode 152 can be positioned between the active layer 130 and the pixel electrode 190. As described above, the drain electrode 152 and the source electrode 111 are provided at different positions and can be made of different materials. For example, the source electrode 111 and the drain electrode 152 can be located at opposite sides of the transistor (e.g., one at an upper side, and the other at an lower side). Also, the gate insulating layer 140 can be additionally provided on the upper surface of the drain electrode 152, and in this situation, the gate insulating layer 140 additionally provided on the upper surface of the drain electrode 152 may not cover at least a part of the second connection part 133 of the active layer 130 so that the drain electrode 152 can contact the second connection part 132 of the active layer 130.

A passivation layer 161 is formed on the bottom surface of the gate electrode 151, the connection electrode 153, and the drain electrode 152, and a planarization layer 162 is formed on the bottom surface of the passivation layer 161.

The passivation layer 161 can include a single layer or multiple layers including an inorganic insulating material and/or an organic insulating material, and the planarizing layer 162 can be formed of an organic insulating material thicker than the passivation layer 161.

A third contact hole CH3 is provided in the passivation layer 161 and the planarization layer 162, so that the lower surface of the drain electrode 152 can be exposed by the third contact hole CH3.

A common electrode 170 is formed on a lower surface of the planarization layer 162. The common electrode 170 is made of a transparent conductive material, and is not formed in the third contact hole CH3 region to prevent a short circuit with the pixel electrode 190 in the third contact hole CH3. Accordingly, the common electrode 170 can be formed on the entire lower surface of the planarization layer 162 except for the third contact hole CH3 region.

A common wiring 175 is formed on a lower surface of the common electrode 170. Since the common wiring 175 can be made of a metal material, a problem of low resistance of the common electrode 170 can be improved and a voltage drop can be prevented. The common wiring 175 is formed to overlap the data line 110 so that an aperture ratio is not reduced due to the addition of the common wiring 175.

An interlayer insulating layer 180 is formed on a lower surface of the common wiring 175. The interlayer insulating layer 180 is formed between the common electrode 170 and the pixel electrode 190 to insulate the common electrode 170 from the pixel electrode 190. The interlayer insulating layer 180 can extend along a side surface of the third contact hole CH3, but can be provided so that at least a part of the drain electrode 152 is exposed.

A pixel electrode 190 is formed on a lower surface of the interlayer insulating layer 180. The pixel electrode 190 extends along the third contact hole CH3 and is connected to the drain electrode 152.

A second light blocking layer 210 is formed on an upper surface of the second substrate 200, which is a surface facing the first substrate 100. The second light blocking layer 210 can be formed of a black material, but is not limited thereto. The second light shielding layer 210 can be formed to overlap the data line 110 to prevent the light from mixing between sub-pixels in the area of the data line 110.

Color filters 221 and 222 are formed on the upper surface of the second light blocking layer 210. The color filters 221 and 222 include a first color filter 221 that transmits light of a first color and a second color filter 222 that transmits light of a second color. The first color filter 221 is provided in the first sub-pixel, and the second color filter 222 is provided in the second sub-pixel. The first color filter 221 and the second color filter 222 can overlap each other in the data line 110 area, which is a boundary area between the first sub-pixel and the second sub-pixel. Accordingly, mixed light can occur in the data line 110 area, but since light emitted from the backlight 300 is blocked by the second light blocking layer 210, the mixed light can be prevented in the data line 110 area.

As described above, since the light emitted from the backlight 300 can be blocked by the gate electrode 151 to protect the channel part 131 of the active layer 130, the second light shielding layer 210 can be formed so as not to overlap with the gate electrode 151 and the channel part 131 of the active layer 130.

The backlight 300 emits light toward the second substrate 200, and various types of backlights can be applied, such as edge type or direct type.

The light emitted from the backlight 300 passes from the second substrate 200 to the gate electrode 151 on the first substrate 100, but further progress is blocked by the gate electrode 151 so that the channel part 131 of the active layer 130 on the gate electrode 151 can be protected from light emitted from the backlight 300.

In addition, a liquid crystal layer is additionally provided between the first substrate 100 and the second substrate 200, and the liquid crystal layer can be sealed by a sealant provided at the edges of the first substrate 100 and the second substrate 200. In addition, a spacer for maintaining a cell gap, for example, a column spacer, can be provided between the first substrate 100 and the second substrate 200.

Figure 3:
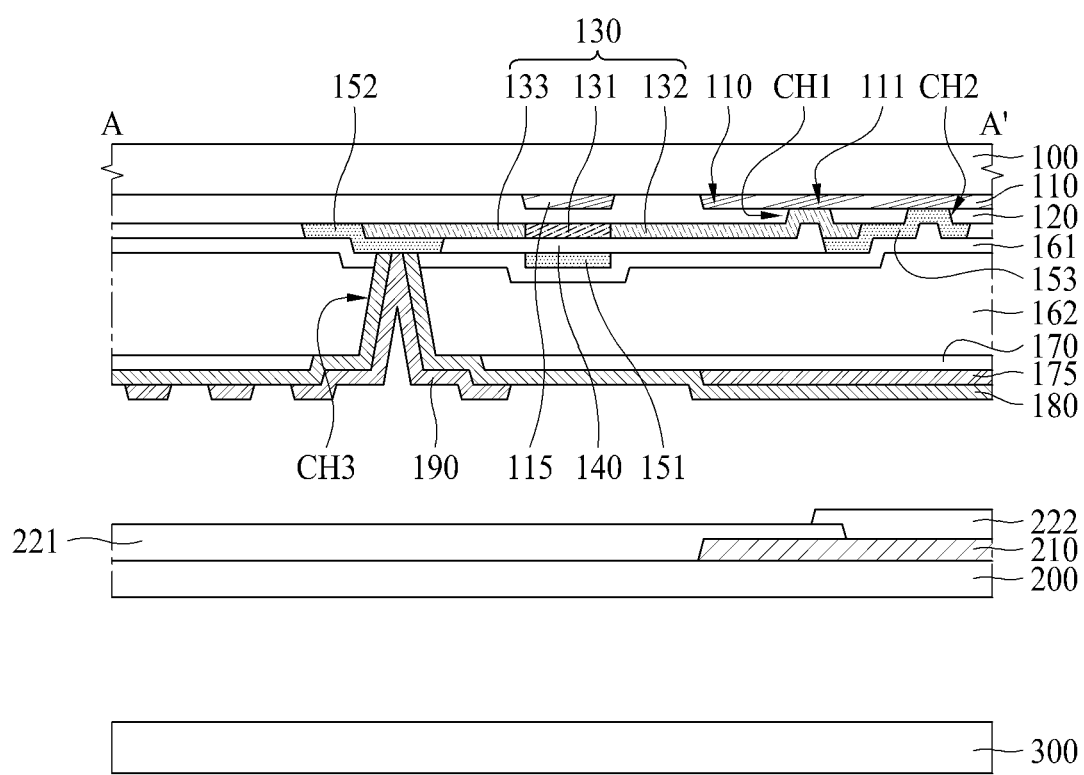
FIG. 3 is a schematic cross-sectional view of the display device according to another embodiment of the present disclosure, which corresponds to a cross-sectional view along A-A' line of FIG. 1.

FIG. 3 is a schematic cross-sectional view of the display device according to the other embodiment of the present disclosure, which corresponds to a cross-sectional view along A-A' line of FIG. 1.

FIG. 3 is the same as the display device according to FIG. 2 except that the structure of the gate insulating layer 140 is changed (e.g., the gate insulating layer 140 is larger and extends farther). Therefore, the same reference numerals are assigned to the same configuration, and only different configurations will be described below.

As shown in FIG. 3, according to another embodiment of the present disclosure, the gate insulating layer 140 is formed not only on the region between the gate electrode 151 and the channel part 131 of the active layer 130, but also on the lower surface of the first connection part 132 of the active layer 130 and a lower surface of the second connection part 133 of the active layer 130 and the lower surface of the buffer layer 120.

Also, same as in FIG. 2, the gate insulating layer 140 can be additionally provided on the upper surface of the connection electrode 153, and in this situation, the gate insulating layer 140 additionally provided on the upper surface of the connection electrode 153 is provided not to cover at least a part of the second contact hole CH2 so that the connection electrode 153 contacts the source electrode 111 through the second contact hole CH2. In addition, the gate insulating layer 140 additionally provided on the upper surface of the connection electrode 153 is provided not to cover at least a part of the first connection part 132 of the active layer 130 so that the connection electrode 153 can contact the first connection part 132 of the active layer 130.

In addition, the gate insulating layer 140 can be additionally provided on the upper surface of the drain electrode 152. The gate insulating film 140 additionally provided on the upper surface of the drain electrode 152 is provided not to cover at least a part of the second connection part 133 of the active layer 130 so that the drain electrode 152 can contact the second connection part 133 of the active layer 130.

Figure 4:
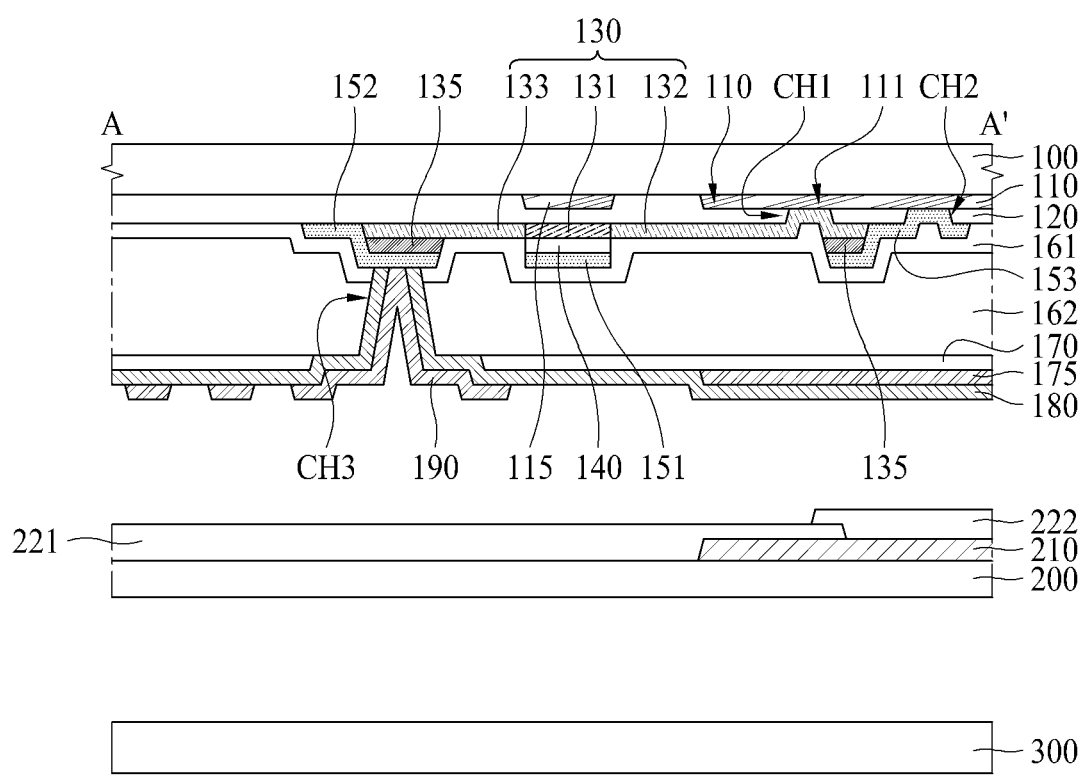
FIG. 4 is a schematic cross-sectional view of the display device according to another embodiment of the present disclosure, which corresponds to a cross-sectional view along A-A' line of FIG. 1.

FIG. 4 is a schematic cross-sectional view of the display device according to another embodiment of the present disclosure, which corresponds to a cross-sectional view along A-A' line of FIG. 1.

FIG. 4 is the same as the display device according to FIG. 2 except that a conductive layer 135 is additionally provided. Therefore, the same reference numerals are assigned to the same configuration, and only different configurations will be described below.

As shown in FIG. 4, according to another embodiment of the present disclosure, conductive layers 135 are formed on a lower surface of a first connection part 132 of an active layer 130 and a lower surface of a second connection part 133 of the active layer 130 (e.g., between the drain electrode 152 and the second connection part 133, and between the first connection part 132 and the connection electrode 153).

A conductive layer 135 provided on a lower surface of the first connection part 132 of the active layer 130 is provided in an end region of the first connection part 132 to contact the connection electrode 153 located below the conductive layer 135. Therefore, the conductive layer 135 is provided between the lower surface of the first connection part 132 of the active layer 130 and the upper surface of the connection electrode 153.

The conductive layer 135 provided on the lower surface of the second connection part 133 of the active layer 130 is provided in the end region of the second connection part 133 to contact the drain electrode 152 located below the conductive layer 135. Therefore, the conductive layer 135 is provided between the lower surface of the second connection part 133 of the active layer 130 and the upper surface of the drain electrode 152.

The conductive layer 135 is formed not to overlap the channel part 131 and the gate electrode 151.

The conductive layer 135 can be made of a metal material having excellent conductivity. According to another embodiment of the present disclosure, the conductive layer 135 having excellent conductivity can be additionally provided, thereby increasing the reaction speed of the thin film transistor and providing for faster switching.

Figure 5:
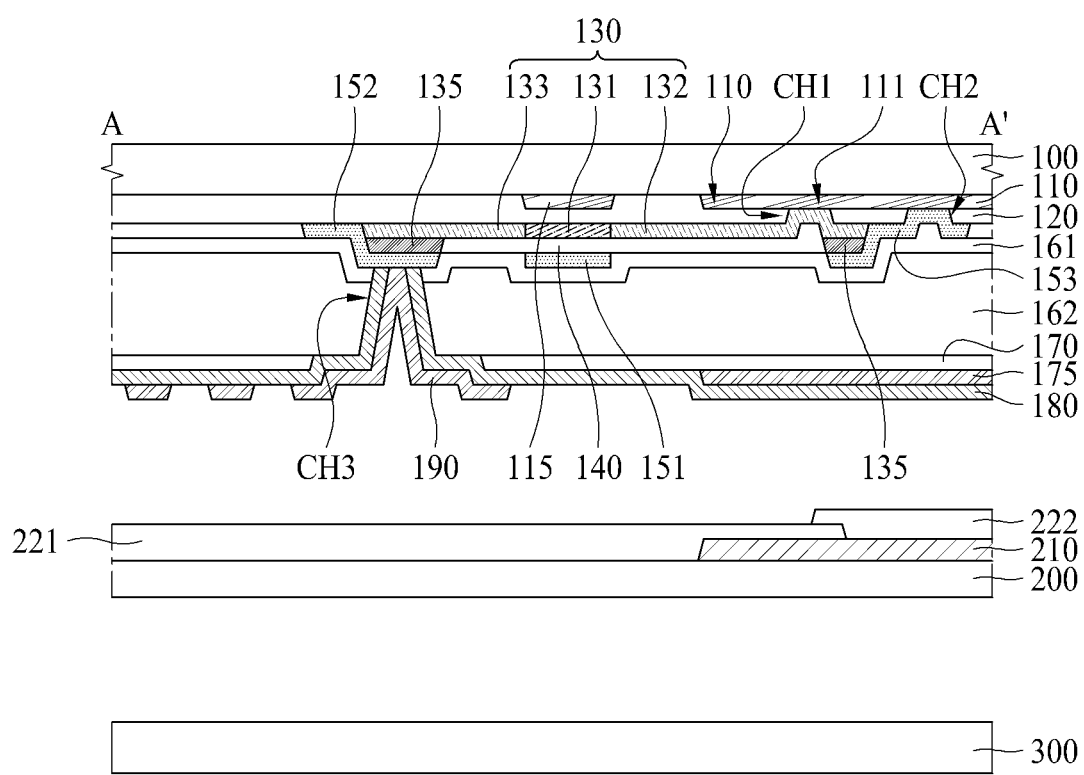
FIG. 5 is a schematic cross-sectional view of the display device according to still another embodiment of the present disclosure, which corresponds to a cross-sectional view along A-A' line of FIG. 1.

FIG. 5 is a schematic cross-sectional view of the display device according to still another embodiment of the present disclosure, which corresponds to a cross-sectional view along A-A' line of FIG. 1.

FIG. 5 is the same as the display device according to FIG. 4 except that the structure of the gate insulating layer 140 is changed (e.g., the gate insulating layer 140 is larger and extends farther, similar to the arrangement in FIG. 3). Therefore, the same reference numerals are assigned to the same configuration, and only different configurations will be described below.

As shown in FIG. 5, the gate insulating layer 140 is formed not only in the region between the gate electrode 151 and the channel part 131 of the active layer 130, but also on the lower surface of the first connection part 132 of the active layer 130, the lower surface of the second connection part 133 of the active layer 130, and the lower surface of the buffer layer 120.

As described above, the gate insulating layer 140 can be additionally provided on a part of the upper surface of the connection electrode 153 and can be additionally provided on a part of the upper surface of the drain electrode 152.

Figure 6:
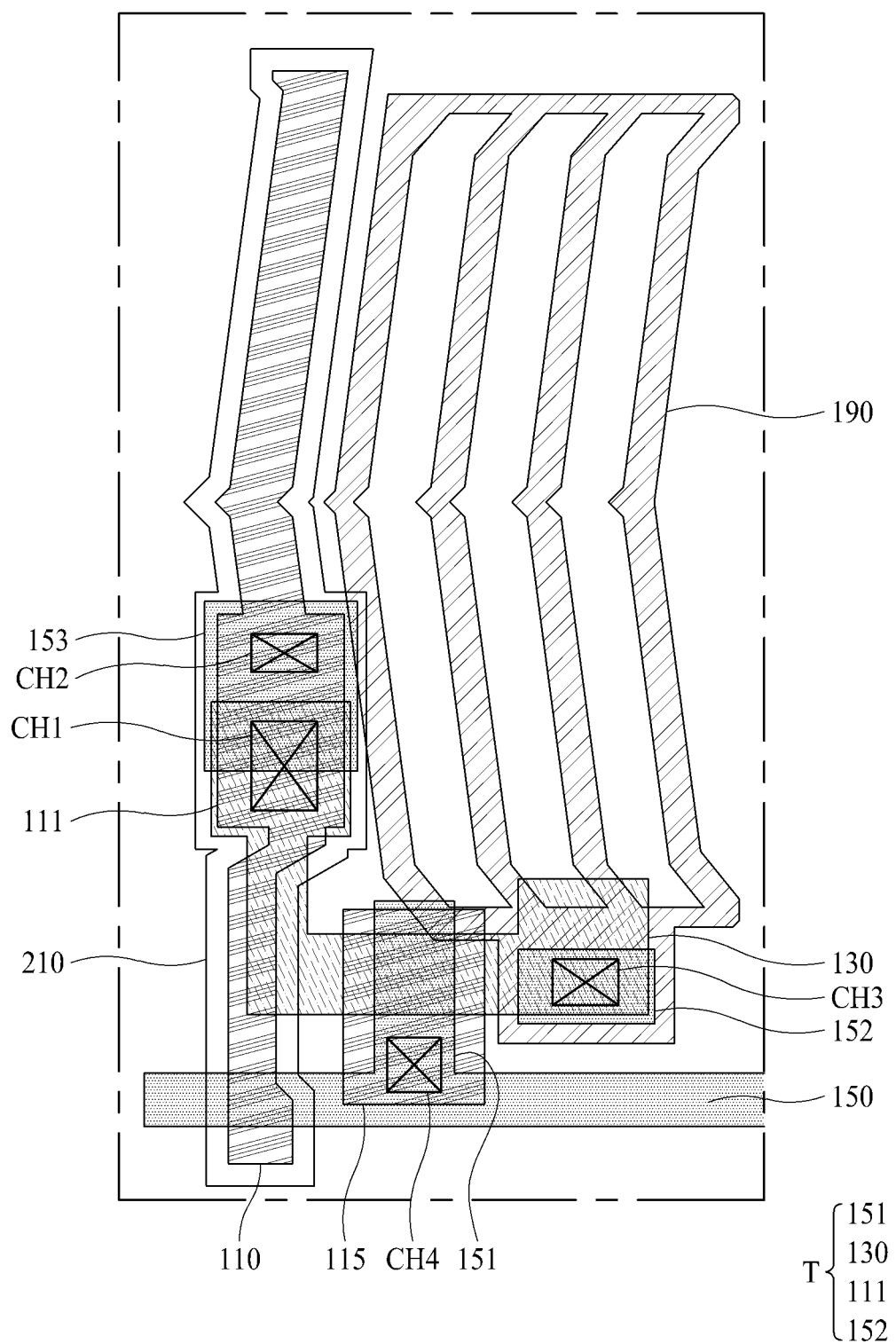
FIG. 6 is a plan view illustrating a display device according to an embodiment of the present disclosure.

FIG. 6 is a plan view illustrating a display device according to the other embodiment of the present disclosure.

FIG. 6 is the same as the display device according to FIG. 1, except that the first light blocking layer 115 is electrically connected to the gate electrode 151. Therefore, the same reference numerals are assigned to the same configuration, and only different configurations will be described below.

According to FIG. 6, the first light blocking layer 115 extends to overlap the gate line 150, and the first light blocking layer 115 is connected to at least one of the gate line 150 and the gate electrode 151 through a fourth contact hole CH4.

The fourth contact hole CH4 is provided in the buffer layer 120 and the gate insulating layer 140, so that at least one of the gate line 150 and the gate electrode 151 can extend through the fourth contact hole CH4 to contact the first light blocking layer 115.

As described above, according to another embodiment of the present disclosure, since the first light blocking layer 115 is electrically connected to the gate electrode 151, the first light blocking layer 115 can function as a second gate electrode, thereby obtaining a double gate structure.

Figure 7:
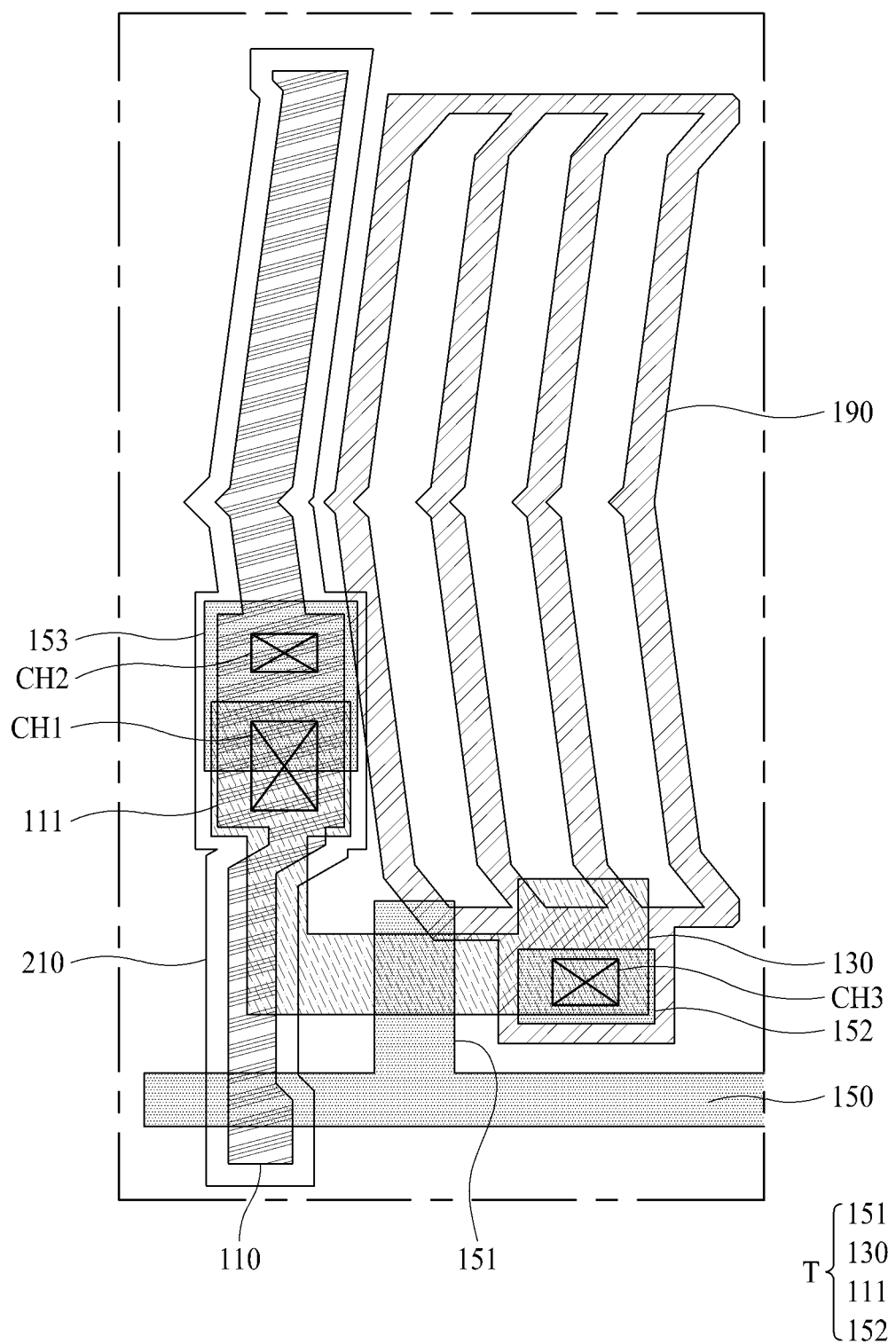
FIG. 7 is a plan view illustrating a display device according to another embodiment of the present disclosure.

FIG. 7 is a plan view illustrating a display device according to another embodiment of the present disclosure.

FIG. 7 is the same as the display device according to FIG. 1 except that the first light blocking layer 115 is omitted. Therefore, the same reference numerals are assigned to the same configuration, and only different configurations will be described below.

Referring to FIG. 2, the first light shielding layer 115 prevents external light incident through the upper surface of the first substrate 100, which is a surface on which an image is displayed, from entering the channel part 131 of the active layer 130. Meanwhile, the channel part 131 of the active layer 130 can be mainly affected by light emitted from the backlight 300 rather than the external light. Light emitted from the backlight 300 is blocked by the gate electrode 151 to prevent the light from being incident on the channel part 131 of the active layer 130. Accordingly, the first light blocking layer 115 can be omitted as shown in FIG. 7.

Figure 8:
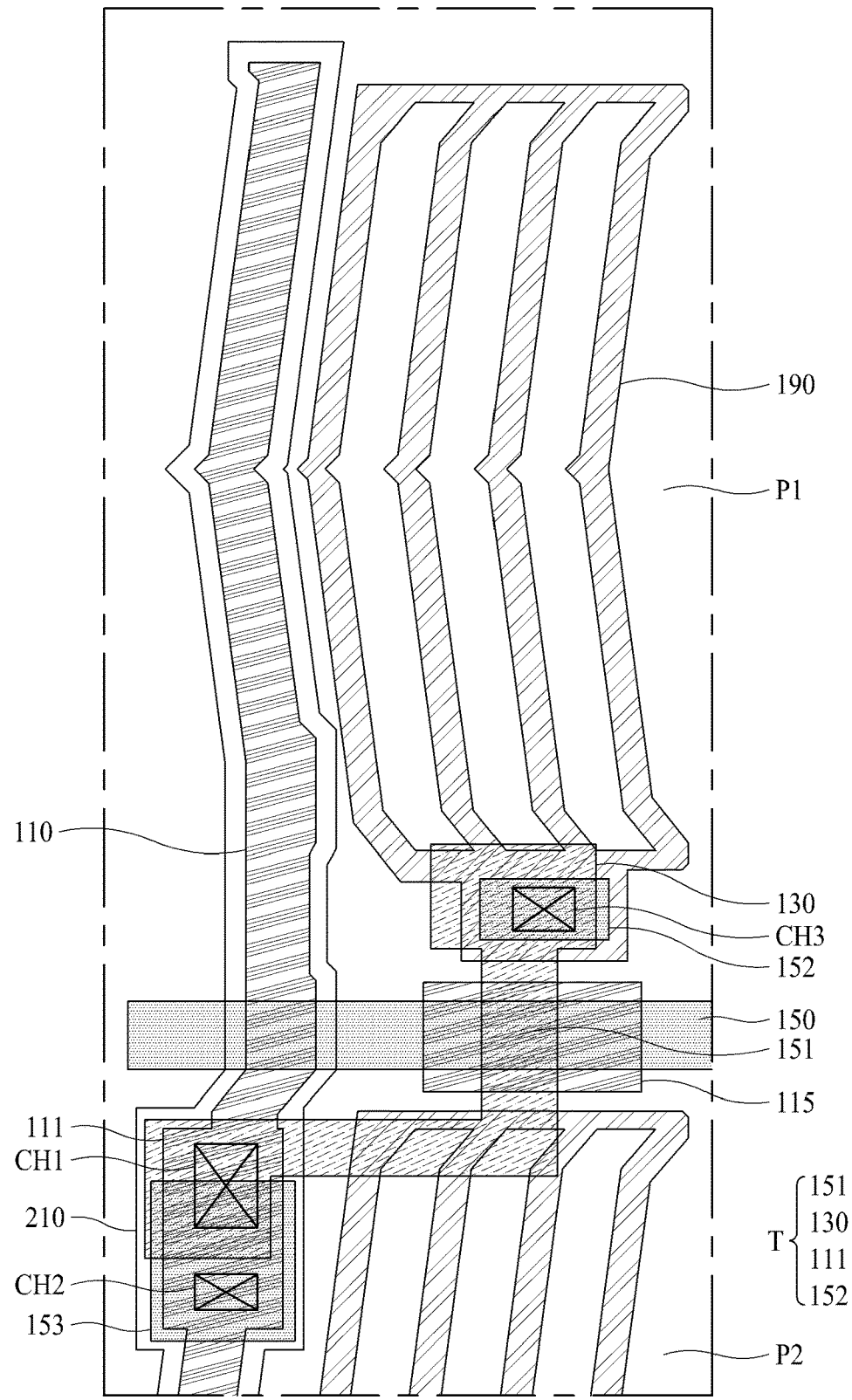
FIG. 8 is a plan view illustrating a display device according to still another embodiment of the present disclosure.

FIG. 8 is a plan view illustrating a display device according to still another embodiment of the present disclosure. Hereinafter, a configuration different from that of FIG. 1 described above will be described.

As shown in FIG. 8, a thin film transistor T driving the first sub-pixel P1 is provided in the first sub-pixel P1 and the second sub-pixel P2 adjacent thereto. Specifically, the gate electrode 151 is configured as a part of the gate line 150. That is, a portion of the gate line 150 overlapping the active layer 130 becomes the gate electrode 151. The source electrode 111 is provided in the region of the second sub-pixel P2 and is configured as a part of the data line 110 in the region of the second sub-pixel P2. The source electrode 111 can be connected to the active layer 130 through a first contact hole CH1 provided in the region of the second sub-pixel P2, and can be connected to the connection electrode 153 through a second contact hole CH2 provided in the region of the second sub-pixel P2. Accordingly, the connection electrode 153 is also provided in the second sub-pixel P2. One end of the active layer 130 overlaps the drain electrode 152 provided in the first sub-pixel P1, the other end of the active layer 130 overlaps the source electrode 111 provided in the second sub-pixel P2, and a portion between one end and the other end of the active layer 130 extends from the first sub-pixel P1 to the second sub-pixel P2 and overlaps the gate electrode 151. Therefore, the end of the first connection part of the active layer 130 connected to the source electrode 111 is provided in the second sub-pixel P2, the end of the second connection part of the active layer 130 connected to the drain electrode 152 is provided in the first sub-pixel P1, and the channel part of the active layer 130 overlapping the gate electrode 151 is provided in an area overlapping the gate line 150.

Meanwhile, although FIG. 8 shows a structure in which the pixel electrode 190 of the second sub-pixel P2 does not overlap the gate line 150, the pixel electrode 190 of the second sub-pixel P2 can overlap the gate line 150.

In the embodiment of FIG. 8, since the thin film transistor T is provided in the first sub-pixel P1 and the second sub-pixel P2, the aperture ratio of the display device can be improved.

The cross-sectional structure of the embodiment of FIG. 8 can be variously changed as shown in FIGS. 2 to 5 described above.

Figure 9:
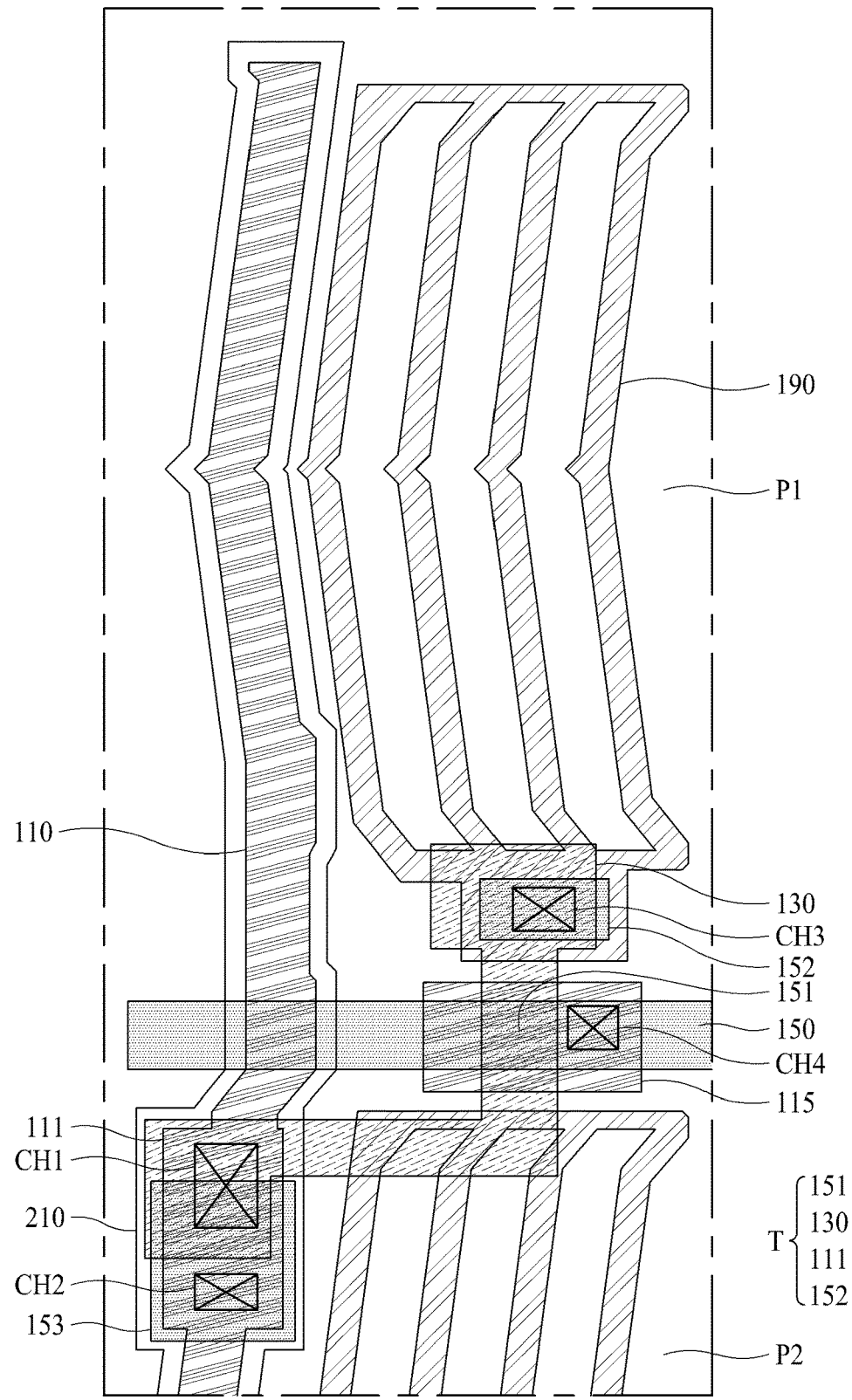
FIG. 9 is a plan view illustrating a display device according to still another embodiment of the present disclosure.

FIG. 9 is a plan view illustrating a display device according to still another embodiment of the present disclosure.

FIG. 9 is the same as the display device according to FIG. 8, except that the first light blocking layer 115 is electrically connected to the gate electrode 151. Therefore, the same reference numerals are assigned to the same configuration, and only different configurations will be described below.

Referring to FIG. 9, the first light blocking layer 115 is connected to the gate line 150 through a fourth contact hole CH4. According to another embodiment of the present disclosure, since the first light blocking layer 115 is electrically connected to the gate electrode 151, the first light blocking layer 115 can function as a second gate electrode, thereby obtaining a double gate structure.

Figure 10:
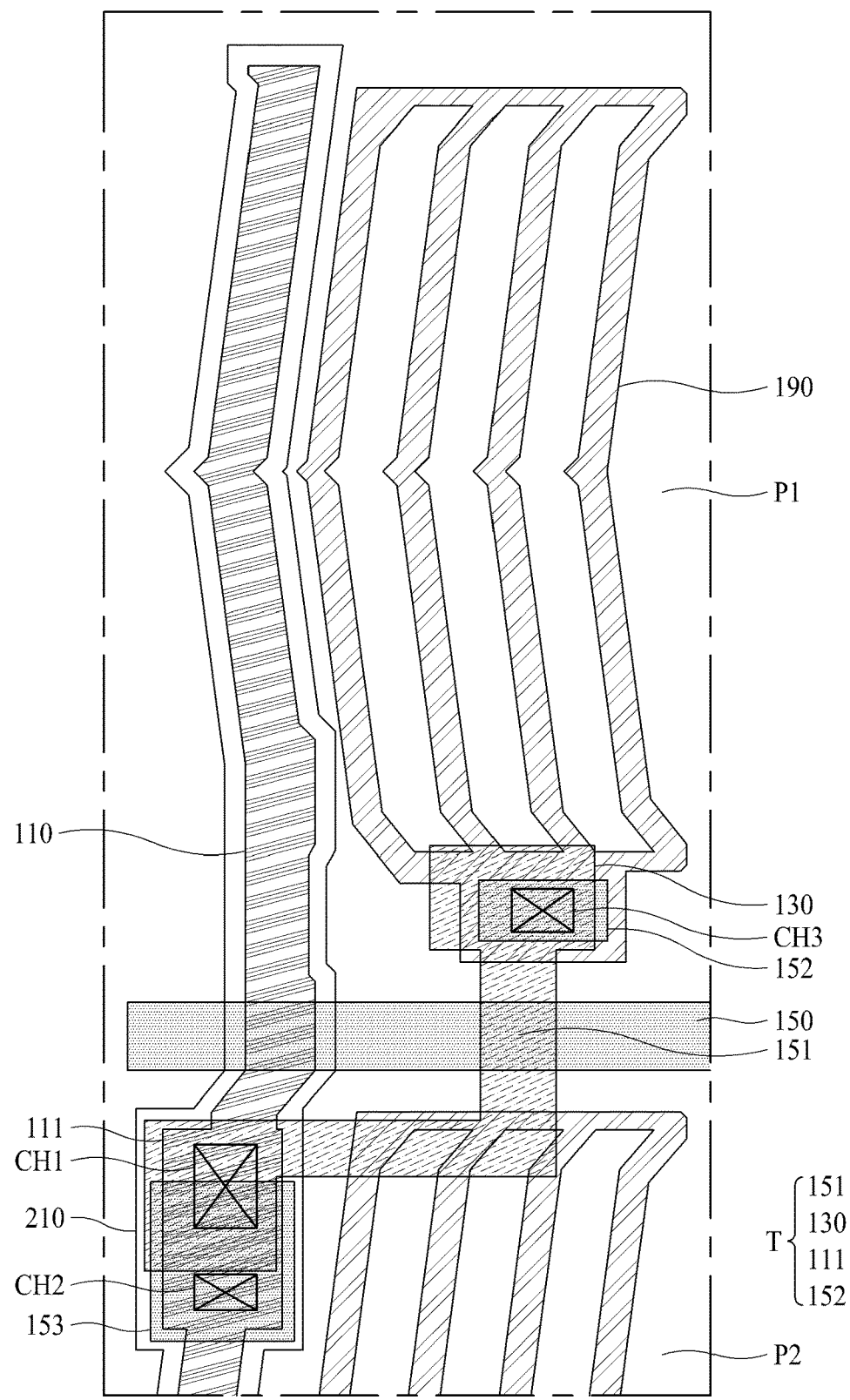
FIG. 10 is a plan view illustrating a display device according to still another embodiment of the present disclosure.

FIG. 10 is a plan view illustrating a display device according to still another embodiment of the present disclosure. FIG. 10 is the same as the display device according to FIG. 8 described above except that the first light blocking layer 115 is omitted.

Figure 11:
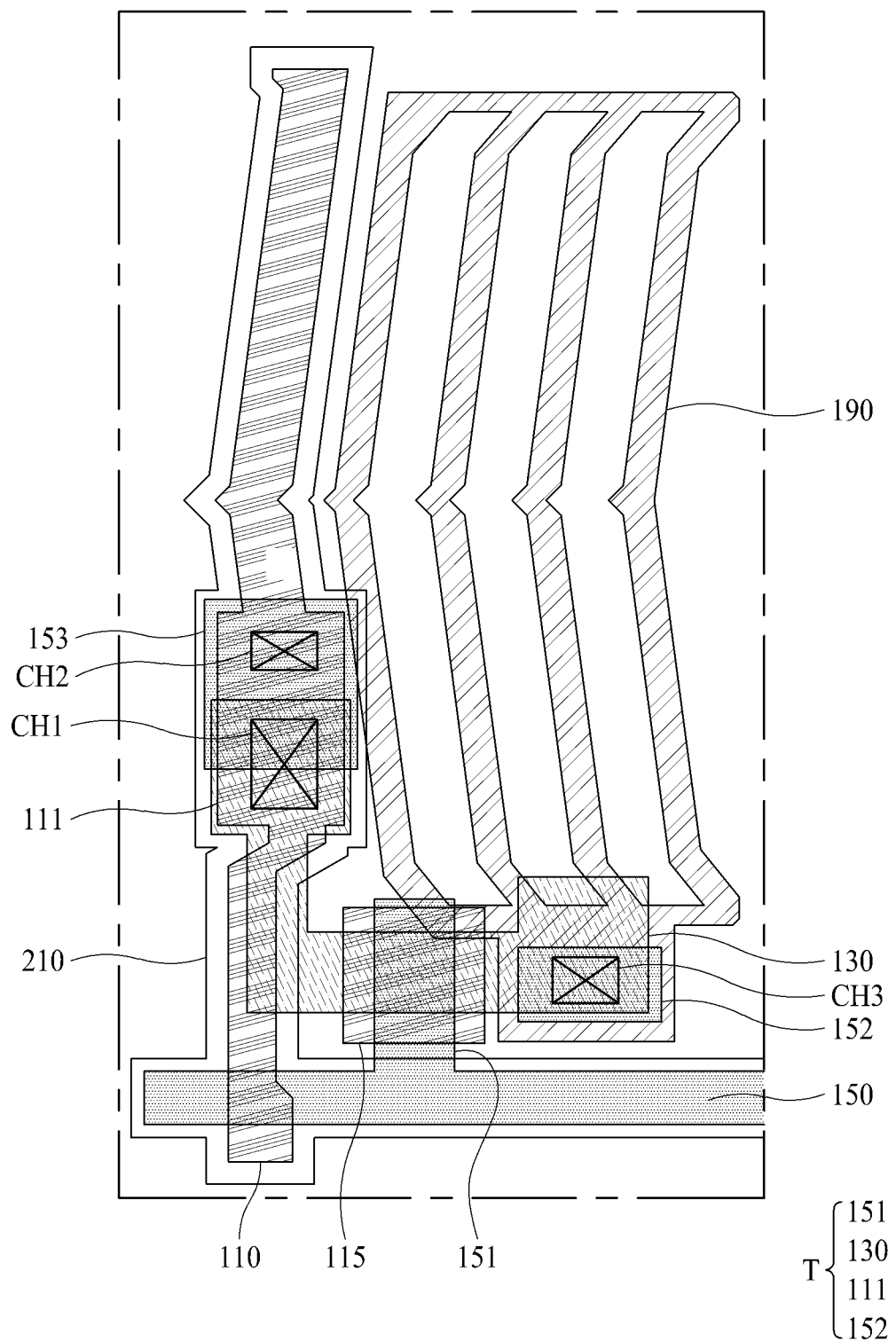
FIG. 11 is a plan view illustrating a display device according to still another embodiment of the present disclosure.

FIG. 11 is a plan view illustrating a display device according to still another embodiment of the present disclosure.

FIG. 11 is different from FIG. 1 described above in that the second light blocking layer 210 overlaps the data line 110 and also overlaps the gate line 150 (e.g., the second light blocking layer 210 can cover both of the data line 110 and the gate line 150). Referring to FIG. 11, the second light blocking layer 210 is provided not to overlap the gate electrode 151 and the drain electrode 152, thereby reducing the problem of decrease in an aperture ratio of the display device caused by the formation of the second light blocking layer 210.

The cross-sectional structure of the embodiment of FIG. 11 can be variously changed as shown in FIGS. 2 to 5 described above.

In addition, in the embodiments of FIGS. 8 to 10, the second light blocking layer 210 can overlap the data line 110 and the gate line 150, and in this situation, the second light blocking layer 210 may not overlap the drain electrode 152, thereby reducing the problem of decrease in an aperture ratio of the display device caused by the formation of the second light blocking layer 210. For example, the second light blocking layer 210 is spaced apart from the drain electrode 152.

Figure 12:
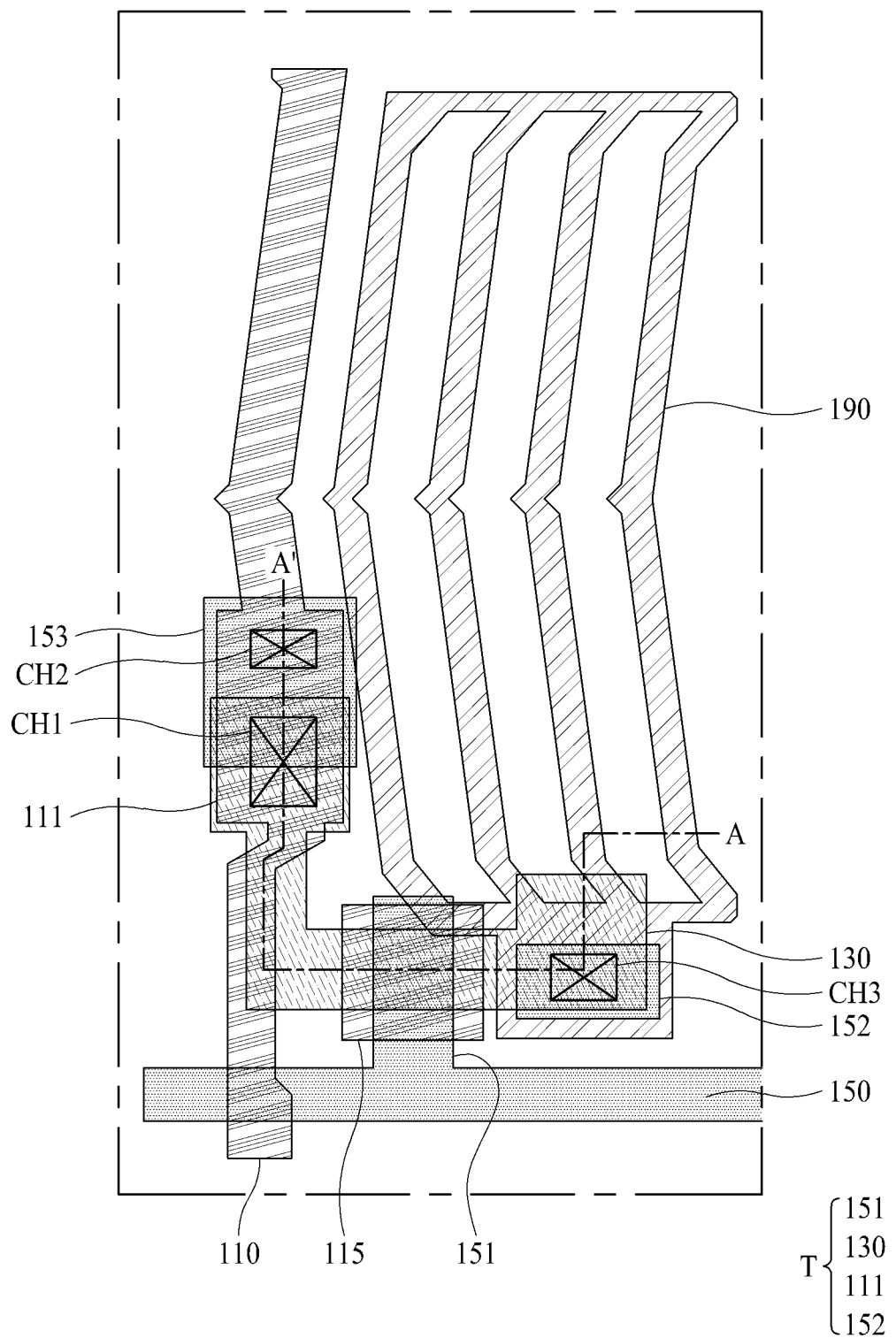
FIG. 12 is a plan view illustrating a display device according to still another embodiment of the present disclosure.

FIG. 12 is a plan view illustrating a display device according to still another embodiment of the present disclosure.

FIG. 12 is different from FIG. 1 described above in that the second light blocking layer 210 is omitted. Even if the second light blocking layer 210 is omitted as shown in FIG. 12, a problem of mixed light between adjacent sub-pixels can be prevented, which will be described later with reference to a cross-sectional view. Meanwhile, the second light blocking layer 210 can be omitted in the above-described embodiments of FIGS. 6 to 10.

Figure 13:
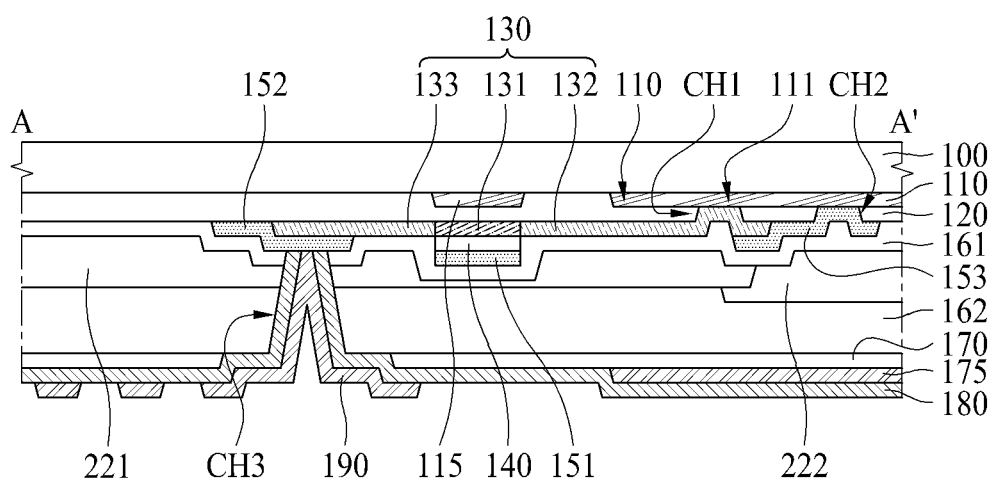
FIG. 13 is a schematic cross-sectional view of the display device according to still another embodiment of the present disclosure, which corresponds to a cross-sectional view along A-A' line of FIG. 12.
Figure 13:
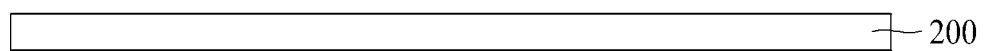
Figure 13:
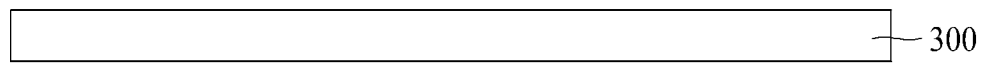

FIG. 13 is a schematic cross-sectional view of the display device according to still another embodiment of the present disclosure, which corresponds to a cross-sectional view along A-A' line of FIG. 12.

As shown in FIG. 13, a display device in accordance with another embodiment of the present disclosure includes a first substrate 100, a second substrate 200, and a backlight 300.

The first substrate 100 is the same as the first substrate 100 of FIG. 2, except that color filters 221 and 222 are additionally included. Therefore, the same reference numerals are assigned to the same configuration, and only different configurations will be described below.

The color filters 221 and 222 are provided between the passivation layer 161 and the planarization layer 162. The first color filter 221 is provided in the first sub-pixel, and the second color filter 222 is provided in the second sub-pixel. The first color filter 221 and the second color filter 222 can overlap each other in the data line 110 area, which is a boundary area between the first sub-pixel and the second sub-pixel.

When light emitted from the backlight 300 passes through the color filters 221 and 222, mixed light can occur in the boundary area between the first sub-pixel and the second sub-pixel. Since the color filters 221 and 222 are formed on the first substrate 100 and the distance between the color filters 221 and 222 and the data line 110 is close, the progress of mixed light can be blocked by the data line 110 to reduce the problem of the mixed light. For example, overlapping portions of color filters 221 and 222 can act as a black matrix to block light and prevent color mixing in a boundary area between sub-pixels. Accordingly, the second light blocking layer 210 for preventing mixing can be omitted from the second substrate 200.

Figure 14:
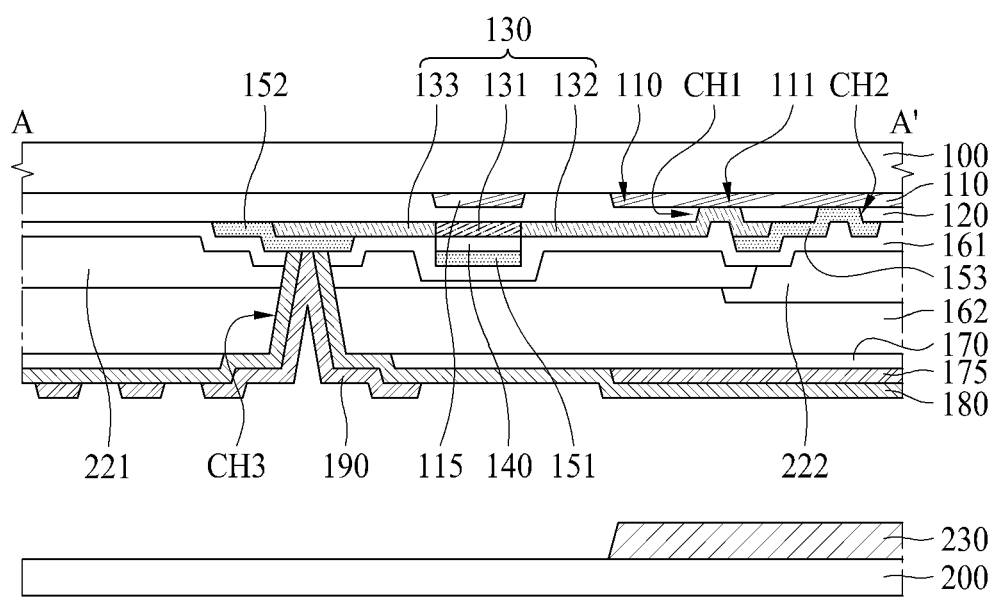
FIG. 14 is a schematic cross-sectional view of the display device according to still another embodiment of the present disclosure, which corresponds to a cross-sectional view along A-A' line of FIG. 12.

FIG. 14 is a schematic cross-sectional view of the display device according to still another embodiment of the present disclosure, which corresponds to a cross-sectional view along A-A' line of FIG. 12.

FIG. 14 is different from FIG. 13 described above in that the configuration of the second substrate 200 is changed. As shown in FIG. 14, a spacer 230, more specifically, a column spacer 230, is provided on an upper surface of the second substrate 200. The column spacer 230 can be provided to perform a function of maintaining a cell gap between the first substrate 100 and the second substrate 200 and to perform a light blocking function (e.g., performs dual functions). Accordingly, the column spacer 230 includes a light shielding material.

The column spacer 230 is formed to overlap the data line 110 of the first substrate 100, and in particular, can extend in the extending direction of the data line 110. That is, the column spacer 230 can have the same pattern as the second light blocking layer 210 of FIG. 1. In some situations, the column spacer 230 can extend in the extending direction of the gate line 150 while overlapping the gate line 150 of the first substrate 100.

Also, in the embodiments of FIGS. 13 and 14, the configuration of the first substrate 100 except for the color filters 221 and 222 can be variously changed as shown in FIGS. 3 to 5.

Figure 15:
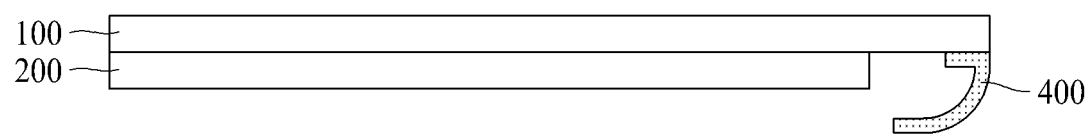
FIG. 15 is a plan view illustrating a display device according to still another embodiment of the present disclosure.

FIG. 15 is a plan view illustrating a display device according to still another embodiment of the present disclosure.

As shown in FIG. 15, a display device in accordance with another embodiment of the present disclosure includes a first substrate 100, a second substrate 200, and a driving unit 400.

The first substrate 100 constitutes an upper substrate, and the second substrate 200 constitutes a lower substrate. The length of the first substrate 100 can be longer than the length of the second substrate 200, and thus a portion of a lower surface of the first substrate 100 can be exposed without being covered by the second substrate 200. An electrode pad is provided on a part of a lower surface of the exposed first substrate 100. The configurations provided on the first substrate 100 and the second substrate 200 are the same as those of the above-described various embodiments, and thus repeated descriptions thereof will be omitted.

The driving unit 400 is mounted on a part of the lower surface of the first substrate 100 that is not covered by the second substrate 200, and is electrically connected to the electrode pad. The driving unit 400 can include a flexible printed circuit (FPC) film and a printed circuit board (PCB). A chip can be formed on the flexible printed circuit (FPC) film to form a COF (Chip On Film) structure. Alternatively, a chip can be formed on the first substrate 100 to form a chip on glass (COG) structure.

The above various embodiments relate to a liquid crystal display device, and the present disclosure can include other display devices having a structure in which a thin film transistor substrate is inverted.

Accordingly, the present disclosure can have the following advantages.

According to an embodiment of the present disclosure, since the channel part of the active layer provided on the first substrate is covered by the gate electrode, there is no need to form a separate light blocking layer on the second substrate to cover the channel part of the active layer, thereby improving the aperture ratio of the display device.

According to an embodiment of the present disclosure, since the second light blocking layer provided on the second substrate does not need to be configured to overlap the thin film transistor region provided on the first substrate, the second light blocking layer can be formed to overlap only the data line or the data line and the gate line, thereby improving the aperture of the display device.

According to an embodiment of the present disclosure, a first light blocking layer is additionally provided between the first substrate and the channel part of the active layer, thereby protecting the channel part from external light.

According to an embodiment of the present disclosure, a conductive layer is additionally formed on one surface of the first connection part and the second connection part of the active layer, thereby improving a reaction rate of the thin film transistor.

According to an embodiment of the present disclosure, a thin film transistor is divided into the first sub-pixel and the second sub-pixel such that the end of the first connection part of the active layer is provided in the second sub-pixel, and the end of the second connection part of the active layer is provided in the first sub-pixel, thereby improving the aperture ratio of the display device.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A display device comprising:
    a first substrate having an upper surface and a lower surface facing the upper surface, the upper surface including a display surface;
    an active layer disposed on the lower surface of the first substrate, the active layer including a channel part, a first connection part connected to a first side of the channel part, and a second connection part connected to a second side of the channel part;
    a gate electrode disposed under the active layer and overlapping with the channel part;
    a first electrode connected to a first surface of the first connection part of the active layer;
    a second electrode connected to a second surface of the first connection part of the active layer;
    a third electrode connected to the second connection part of the active layer;
    a second substrate disposed under the gate electrode;
    a liquid crystal layer disposed between the first substrate and the second substrate; and
    a backlight disposed under the second substrate,
    wherein the gate electrode is disposed between the channel part and the backlight, and
    wherein the first electrode is disposed between the first substrate and the active layer.

2. The display device according to claim 1, wherein the first surface of the first connection part is opposite to the second surface of the first connection part.

3. The display device according to claim 1, wherein the first surface is an upper surface of the first connection part, and the second surface is a lower surface of the first connection part.

4. The display device according to claim 1, further comprising a buffer layer disposed between the first electrode and the active layer.

5. The display device according to claim 4, wherein the first electrode is connected to the first surface of the first connection part through a first contact hole in the buffer layer.

6. The display device according to claim 4, wherein the first electrode is connected to the second electrode through a second contact hole in the buffer layer.

7. The display device according to claim 1, further comprising a passivation layer under the gate electrode, the second electrode and the third electrode.

8. The display device according to claim 7,
    wherein the second electrode and the third electrode are disposed between the active layer and the passivation layer.

9. The display device according to claim 1, wherein light emitted from the backlight is blocked by the gate electrode after passing through the second substrate and the liquid crystal layer, and is prevented from being incident on the channel part.

10. The display device according to claim 1, further comprising a first light blocking layer disposed between the first substrate and the active layer, wherein the first light blocking layer overlaps with the channel part of the active layer.

11. The display device according to claim 10, wherein the first light blocking layer is made of a conductive material and is electrically connected to the gate electrode.

12. The display device according to claim 1, further comprising:
    a gate line and a data line disposed to cross each other on the lower surface of the first substrate; and a second light shielding layer disposed on an upper surface of the second substrate and overlapping with at least one of the gate line and the data line.

13. The display device according to claim 12, wherein the first electrode and the second electrode are electrically connected to the data line, and
wherein the second light blocking layer does not overlap with the third electrode.

14. The display device according to claim 1, further comprising:
a gate line and a data line disposed to cross each other on the lower surface of the first substrate; and
a column spacer disposed on an upper surface of the second substrate and overlapping with at least one of the gate line and the data line, the column spacer including a light shielding material.

15. The display device according to claim 1, further comprising a color filter disposed on the lower surface of the first substrate,
wherein a separate light shielding layer is not provided on the second substrate.

16. The display device according to claim 1, wherein a length of the first substrate is longer than a length of the second substrate, and
wherein a driving unit is attached on an exposed part of the lower surface of the first substrate that is not covered by the second substrate.

17. The display device according to claim 1, further comprising a first sub-pixel and a second sub-pixel disposed on the first substrate,
wherein an end of the first connection part of the active layer is in the second sub-pixel, and an end of the second connection part of the active layer is in the first sub-pixel.

18. The display device according to claim 1, further comprising a gate insulating layer disposed between the active layer and the gate electrode,
wherein the gate insulating layer overlaps with the channel part, a portion of the first connection part and a portion of the second connection part.

19. The display device according to claim 1, further comprising a conductive layer disposed between the first connection part of the active layer and the first electrode,
wherein the conductive layer does not to overlap the gate electrode.

* * * * *